(12) United States Patent
Mochizuki et al.

(10) Patent No.: US 8,293,849 B2
(45) Date of Patent: Oct. 23, 2012

(54) SILICONE COMPOSITION FOR SEALING LIGHT EMITTING ELEMENT, AND LIGHT EMITTYING DEVICE

(75) Inventors: Kikuo Mochizuki, Tokyo (JP); Nobuo Hirai, Tokyo (JP)

(73) Assignee: Momentive Performance Materials Japan LLC, Tokyo (JP)

( * ) Notice: Subject to any disclaimer, the term of this patent is extended or adjusted under 35 U.S.C. 154(b) by 998 days.

(21) Appl. No.: 11/795,603

(22) PCT Filed: Jul. 22, 2005

(86) PCT No.: PCT/JP2005/013451
§ 371 (c)(1),
(2), (4) Date: Jul. 19, 2007

(87) PCT Pub. No.: WO2006/077667
PCT Pub. Date: Jul. 27, 2006

(65) Prior Publication Data
US 2008/0160322 A1 Jul. 3, 2008

(30) Foreign Application Priority Data

Jan. 24, 2005 (JP) ................................. 2005-015263

(51) Int. Cl.
*C08G 77/08* (2006.01)
(52) U.S. Cl. ............... 525/478; 528/15; 528/31; 528/32
(58) Field of Classification Search .................. 525/478; 528/15, 31, 32
See application file for complete search history.

(56) References Cited

U.S. PATENT DOCUMENTS

| | | | |
|---|---|---|---|
| 5,739,199 A | | 4/1998 | Eguichi et al. |
| 5,741,439 A | * | 4/1998 | Armstrong et al. ............. 516/73 |
| 5,994,461 A | * | 11/1999 | Nakamura et al. ............. 524/862 |
| 6,124,407 A | * | 9/2000 | Lee et al. ....................... 525/478 |
| 2004/0116640 A1 | | 6/2004 | Miyoshi |
| 2004/0178509 A1 | | 9/2004 | Yoshino et al. |
| 2005/0006794 A1 | | 1/2005 | Kashiwagi et al. |

FOREIGN PATENT DOCUMENTS

| | | |
|---|---|---|
| EP | 0 997 498 A1 | 5/2000 |
| EP | 1 424 363 A1 | 6/2004 |
| JP | 07-294701 A | 11/1995 |
| JP | 2000-198930 A | 7/2000 |
| JP | 2001-002922 A | 1/2001 |
| JP | 2002-338833 A | 11/2002 |
| JP | 2003-073548 A | 3/2003 |
| JP | 2004-002810 A | 1/2004 |
| JP | 2004-140220 A | 5/2004 |
| JP | 2004-186168 A | 7/2004 |
| JP | 2004-292807 A | 10/2004 |
| JP | 2004-359756 A | 12/2004 |
| JP | 2005-042099 A | 2/2005 |
| WO | WO 2004/107458 A2 | 12/2004 |

* cited by examiner

*Primary Examiner* — Margaret Moore
(74) *Attorney, Agent, or Firm* — Foley & Lardner LLP

(57) ABSTRACT

A silicone composition for sealing a light emitting element includes: (A) a vinyl group-containing organopolysiloxane having a three-dimensional network structure represented by an average unit formula: $(SiO_{4/2})_a(ViR_2SiO_{1/2})_b(R_3SiO_{1/2})_c$ (where Vi represents a vinyl group, R's are identical or different substituted or unsubstituted monovalent hydrocarbon groups other than alkenyl groups, and a, b, and c are positive numbers satisfying that $a/(a+b+c)$ is 0.2 to 0.6 and $b/(a+b+c)$ is 0.001 to 0.2); (B) an organohydrogenpolysiloxane which has at least two hydrogen atoms, each hydrogen atom being bonded to a silicon atom per molecule, the organohydrogenpolysiloxane being contained in such an amount that an amount of a hydrogen atom bonded to a silicon atom is 0.3 to 3.0 mol per 1 mol of a vinyl group bonded to a silicon atom in the component (A); and (C) a hydrosilylation catalyst (catalytic amount), wherein a coefficient of linear expansion of the composition after curing is $10 \times 10^{-6}$ to $290 \times 10^{-6}/°$ C. It is possible to obtain a cured product whose residual stress with a support substrate is reduced and which has long-term satisfactory and stable adhesiveness.

4 Claims, 1 Drawing Sheet

SILICONE COMPOSITION FOR SEALING LIGHT EMITTING ELEMENT, AND LIGHT EMITTYING DEVICE

TECHNICAL FIELD

The present invention relates to a silicone composition for sealing a light emitting element which is used to seal a light emitting element such as, for example, a diode and a transistor, and a light emitting device obtained by using the composition.

BACKGROUND ART

In a light emitting device such as a light emitting diode (LED) and a photocoupler, a composition for sealing a light emitting element is required not only to have a function of protecting the light emitting element from an external part but also to have satisfactory and stable adhesiveness to the light emitting element or a support substrate of polyphthalamide, ceramics, or the like supporting the light emitting element. The composition is also required to have high transparency so as not to decrease luminance of the light emitting element.

As such a sealing composition, for example, epoxy resin and the like have been conventionally used. However, in LEDs and the like, in accordance with the recent increase in luminance, a heat generation amount has been increasing and the wavelength of light has been shortened, and thus the use of the epoxy resin has been a cause of cracking and yellowing.

Therefore, as a sealing composition excellent in heat resistance and ultraviolet resistance, an organopolysiloxane component (silicone composition) has been used. In particular, an addition-reaction type silicone composition utilizing hydrosilylation has been widely used since it is excellent in productivity because of its quick curabililty by heating and it produces no byproduct when cured.

As the addition-reaction type silicone composition, for example, a patent document 1 describes a silicone composition comprising: a diorganopolysiloxane containing at least two alkenyl groups, each alkenyl group being bonded to a silicone atom per molecule; an organopolysiloxane which contains $SiO_{4/2}$ units, $Vi(R^3)_2SiO_{1/2}$ units, and $R^3{}_3SiO_{1/2}$ units (where Vi represents a vinyl group, $R^3$ represents an unsubstituted or substituted monovalent hydrocarbon group containing no aliphatic unsaturated bond); an organohydrogenpolysiloxane containing, per molecule, at least two hydrogen atoms, each hydrogen atom being bonded to a silicon atom; and a platinum group metal catalyst.

However, the silicone composition described in the patent document 1 after cured has a higher coefficient of linear expansion than a support substrate and thus has a high residual stress after heated and cured, which has posed problems that it peels off on an interface with the support substrate and the deformation of the support substrate occurs (see, for example, Patent Reference 1).

Patent Reference 1: JP-A 2000-198930 (KOKAI)

DISCLOSURE OF THE INVENTION

The present invention was made to solve these problems and its object is to provide a silicone composition for sealing a light emitting element which has excellent adhesiveness to a support substrate when turned into a cured product and to provide a light emitting device in which a light emitting element is sealed by the cured product.

A silicone composition for sealing a light emitting element according to a first embodiment of the present invention includes: (A) a vinyl group-containing organopolysiloxane having a three-dimensional network structure represented by an average unit formula: $(SiO_{4/2})_a(ViR_2SiO_{1/2})_b(R_3SiO_{1/2})_c$ (where Vi represents a vinyl group, R's are identical or different substituted or unsubstituted monovalent hydrocarbon groups other than alkenyl groups, and a, b, and c are positive numbers satisfying that a/(a+b+c) is 0.2 to 0.6 and b/(a+b+c) is 0.001 to 0.2); (B) an organohydrogenpolysiloxane which has at least two hydrogen atoms, each hydrogen atom being bonded to a silicon atom per molecule, the organohydrogenpolysiloxane being contained in such an amount that an amount of a hydrogen atom bonded to a silicon atom is 0.3 to 3.0 mol per 1 mol of a vinyl group bonded to a silicon atom in the component (A); and (C) a hydrosilylation catalyst (catalytic amount), wherein a coefficient of linear expansion of the composition after curing is $10 \times 10^{-6}$ to $290 \times 10^{-6}$/° C.

A silicone composition for sealing a light emitting element according to a second embodiment of the present invention includes: ($A_1$) a vinyl group-containing organopolysiloxane having a three-dimensional network structure which is a solid at 25° C. and is represented by an average unit formula: $(SiO_{4/2})_a(ViR_2SiO_{1/2})_b(R_3SiO_{1/2})_c$ (where Vi represents a vinyl group, R's represent identical or different substituted or unsubstituted monovalent hydrocarbon groups other than alkenyl groups, and a, b, and c are positive numbers satisfying that a/(a+b+c) is 0.2 to 0.6 and b/(a+b+c) is 0.001 to 0.2); ($A_2$) a straight-chain organopolysiloxane having alkenyl groups whose viscosity at 25° C. is 1 to a 100,000 mPa·s, amount of the organopolysiloxane being 10 to 80% by weight of a total amount of the component ($A_1$) and the component ($A_2$); (B) an organohydrogenpolysiloxane which has at least two hydrogen atoms, each hydrogen atom being bonded to a silicon atom per molecule, the organohydrogenpolysiloxane being contained in such an amount that an amount of a hydrogen atom bonded to a silicon atom is 0.3 to 3.0 mol per 1 mol of a sum of a vinyl group bonded to a silicon atom in the component ($A_1$) and an alkenyl group bonded to a silicon atom in the component ($A_2$); and (C) a hydrosilylation catalyst (catalytic amount), wherein a coefficient of linear expansion of the composition after curing is $10 \times 10^{-6}$ to $290 \times 10^{-6}$/° C.

A light emitting device according to a first embodiment of the present invention includes a light emitting element that is sealed in the light emitting device with a cured product of the above-described silicone composition for sealing the light emitting element of the first embodiment.

A light emitting device of a second embodiment of the present invention includes a light emitting element that is sealed in the light emitting device with a cured product of the above-described silicone composition for sealing the light emitting element of the second embodiment.

According to the silicone composition for sealing the light emitting element of the present invention, since the composition after cured has a $10 \times 10^{-6}$ to $290 \times 10^{-6}$/° C. coefficient of linear expansion, it is possible to reduce a residual stress of the cured product to the support substrate, and therefore, it is possible to obtain a cured product having long-term satisfactory and stable adhesiveness.

Further, according to the light emitting device of the present invention, the light emitting device can have high reliability owing to excellent adhesiveness between the cured product and the support substrate.

BEST MODE FOR CARRYING OUT THE INVENTION

Figure 1:
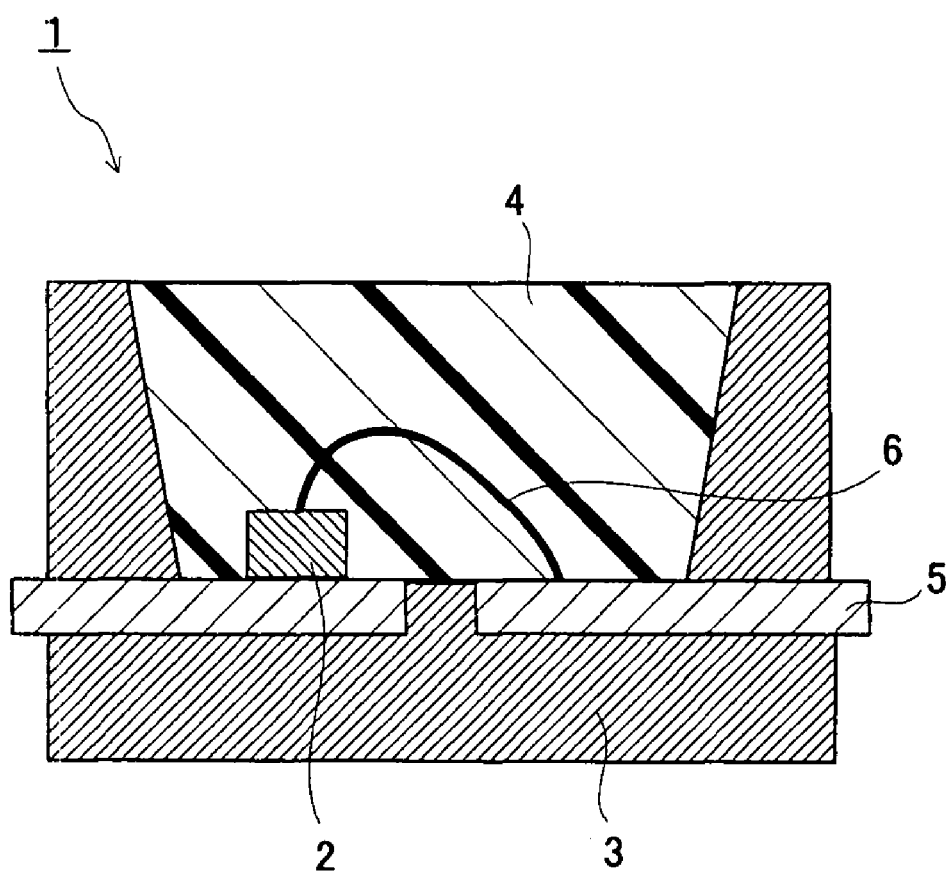
FIG. 1 is a cross-sectional view showing an example of a light emitting device of the present invention.

Next, preferred embodiments of the present invention will be described. It should be noted that the present invention is not limited to the following embodiments.

A silicone composition for sealing a light emitting element according to the embodiment of the present invention includes: (A) a vinyl group-containing organopolysiloxane having a three-dimensional network structure represented by an average unit formula: $(SiO_{4/2})_a(ViR_2SiO_{1/2})_b(R_3SiO_{1/2})_c$ (where Vi represents a vinyl group, R's are identical or different substituted or unsubstituted monovalent hydrocarbon groups other than alkenyl groups, and a, b, and c are positive numbers satisfying that a/(a+b+c) is 0.2 to 0.6 and b/(a+b+c) is 0.001 to 0.2); (B) an organohydrogenpolysiloxane containing at least two hydrogen atoms, each hydrogen atom being bonded to a silicon atom per molecule; and (C) a hydrosilylation catalyst (catalytic amount).

The component (A), which is a major component of the obtained composition, is a vinyl group-containing organopolysiloxane having a three-dimensional network structure represented by an average unit formula: $(SiO_{4/2})_a(ViR_2SiO_{1/2})_b(R_3SiO_{1/2})_c$. It needs to have at least one vinyl group or more, each vinyl group being bonded to a silicon atom in 1 molecule, and in particular, preferably has two or more vinyl groups.

In the above formula, Vi represents a vinyl group, R's represent identical or different substituted or unsubstituted monovalent hydrocarbon groups other than an alkenyl group, and a, b, and c represent positive numbers.

R's represent substituted or unsubstituted monovalent hydrocarbon groups, other than alkenyl groups, whose carbon number is 1 to 12, preferably 1 to 8. Examples of R's include: alkyl groups such as a methyl group, an ethyl group, a propyl group, an isopropyl group, a butyl group, an isobutyl group, a tert-butyl group, a hexyl group, a cyclohexyl group, and an oxtyl group; aryl groups such as a phenyl group and a tolyl group; aralkyl groups such as a benzyl group and a phenylethyl group; and any of these groups with part or all of hydrogen atoms being substituted by halogen atoms such as fluorine, chlorine, or bromine or by a cyano group, for example, a chloromethyl group, a bromoethyl group, a trifluoropropyl group, a cyanoethyl group, and the like. In particular, a methyl group and a phenyl group are preferable.

In the above formula, a, b, and c are positive numbers satisfying that a/(a+b+c) is 0.2 to 0.6 and b/(a+b+c) is 0.001 to 0.2.

That is, the $SiO_{4/2}$ unit preferably has a ratio of 0.2 to 0.6, more specifically, 0.2 to 0.4 in the component (A). Such a range makes it possible to give excellent fluidity to the composition.

The $ViR_2SiO_{1/2}$ unit is a crosslinking point of the obtained composition and preferably has a ratio of 0.001 to 0.2, more specifically, 0.001 to 0.1 in the component (A). If the ratio is less than 0.001, the cured product cannot have adequate hardness, which makes it difficult to synthesize a polymer having a vinyl group with a high yield. On the other hand, if the ratio exceeds 0.2, the cured product resulting from the curing of the composition has too high hardness, which makes it difficult to obtain sufficient rubber elasticity.

Such a vinyl group-containing organopolysiloxane of the three-dimensional network structure can be manufactured by a generally-known method in such a manner that chemical compounds as the respective unit sources are combined at the aforesaid ratio and are cohydrolyzed under the presence of acid such as hydrochloric acid.

The component (A) can be used by itself or two kinds or more of them may be mixed for use. The component (A) is a solid or a liquid, and in particular, is preferably a liquid having a 1 to 100,000 mPa·s viscosity at 25° C.

Further, in a case where the component (A) is a solid at 25° C., the component (A) is preferably diluted with, for example, a straight-chain organopolysiloxane having alkenyl groups having a 1 to 100,000 mPa·s viscosity at 25° C. so as to have a 100 to 100,000 mPa·s viscosity at 25° C. At this time, a coefficient of linear expansion of the composition after curing has to be not greater than $290 \times 10^{-6}/°$ C.

An alkenyl group of this straight-chain organopolysiloxane having alkenyl groups may exist only at both ends of a molecular chain, or may exist at both ends of the molecular chain and in the middle of the molecular chain. A typical example of such a straight-chain organopolysiloxane having alkenyl groups is represented by the following general formula:

[Formula 1]

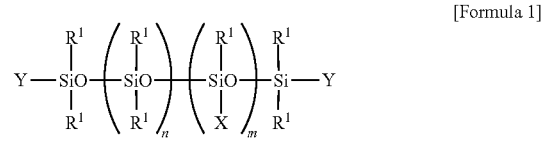

(where $R^1$'s are identical or different substituted or unsubstituted monovalent hydrocarbon groups, other than an alkenyl group, whose carbon number is 1 to 10, preferably 1 to 6, X is an alkenyl group, Y is an alkenyl group or $R^1$, n is 0 or an integer equal to 1 or more, and m is 0 or an integer equal to 1 or more).

Examples of $R^1$'s include unsubstituted or substituted alkyl groups with the carbon number of 1 to 3 such as a methyl group, an ethyl group, a propyl group, a chloromethyl group, a bromoethyl group, a 3,3,3-trifluoropropyl group, and a cyanoethyl group; and unsubstituted or substituted phenyl groups such as a phenyl group, a chlorophenyl group, and a fluorophenyl group.

X is an alkenyl group, and examples thereof include alkenyl groups with the carbon number of about 2 to 8, such as a vinyl group, an allyl group, a propenyl group, an isopropenyl group, a butenyl group, a hexenyl group, and a cyclohexenyl group, and more preferable are low alkenyl groups with the carbon number of 2 to 4, such as a vinyl group and an allyl group.

Y is an alkenyl group or $R^1$, and examples of this alkenyl group include those of the aforesaid X. $R^1$ has the same meaning as those described above, and preferably, the two Y's as substituents bonded to silicon atoms at the both ends of the molecular chain may be identical or different, but preferably, both of them are alkenyl groups.

n is 0 or an integer equal to 1 or more, preferably, an integer of 0 to 1000, more preferably, an integer of 0 to 800. m is 0 or an integer equal to 1 or more, preferably, an integer of 0 to 1000. Further, n and m preferably satisfy $1 \leq m+n \leq 1000$ and $0 \leq m/(m+n) \leq 1$, and more preferably satisfy $100 \leq m+n \leq 800$ and $0 \leq m/(m+n) \leq 0.5$.

A compounding amount of this straight-chain organopolysiloxane having alkenyl groups is 10 to 80% by weight, preferably, 10 to 60% by weight of the total amount (100% by weight) of itself and the component (A). If the ratio is less than 10% by weight, the composition is difficult to have sufficient fluidity, and if the ratio exceeds 80% by weight, it is difficult to adjust a coefficient of linear expansion of the cured product to $290 \times 10^{-6}/°$ C. or lower.

The component (B) works as a crosslinking agent for curing the composition by a hydrosilylation reaction with the component (A). It needs to have at least two or more hydrogen atoms, each hydrogen atom being bonded to a silicon atom (a SiH group) on average in 1 molecule. The number of the SiH groups that the component (B) preferably has is 2 to 200, more preferably 3 to 100. The hydrogen atom bonded to the silicon atom may be bonded to silicon atoms at both ends of a molecular chain, may be bonded to one of silicon atoms in the middle of the molecular chain. Further, the hydrogen atoms may be bonded to the both.

As the component (B), used is that represented by the following average composition formula:

$$R^2{}_d H_e SiO_{[4-(d+e)]/2}$$

In the above formula, $R^2$ is a substituted or unsubstituted monovalent hydrocarbon group, other than an aliphatic unsaturated hydrocarbon group, having 1 to 12 carbon atoms, preferably, 1 to 8 carbon atoms.

Examples of R' include: alkyl groups such as a methyl group, an ethyl group, a propyl group, an isopropyl group, a butyl group, an isobutyl group, a tert-butyl group, a hexyl group, a cyclohexyl group, and an oxtyl group; aryl groups such as a phenyl group and a tolyl group; aralkyl groups such as a benzyl group and a phenylethyl group; and any of these groups with part or all of hydrogen atoms being substituted by halogen atoms such as fluorine, chlorine, or bromine, or by cyano groups, for example, a chloromethyl group, a bromoethyl group, a trifluoropropyl group, a cyanoethyl group, and the like. Among them, that with the carbon number of 1 to 4 is suitable, and in view of synthesis easiness and cost, an alkyl group is preferable. A methyl group, an ethyl group, a propyl group, an isopropyl group, a butyl group, an isobutyl group, or a tert-butyl group is preferable, and in particular, a methyl group is preferable.

In the above formula, d and e are both positive numbers satisfying $0.8 \leq d \leq 2.2$, $0.002 \leq e \leq 1$, and $0.8 < d+e < 3$, and preferably satisfying $1 \leq d \leq 2.2$, $0.01 \leq e \leq 1$, and $1.8 \leq d+e \leq 2.5$.

Its molecular structure may be any of a straight chain, a branched chain, and a cyclic chain, but is preferably a three-dimensional network structure containing a diorganohydrogensiloxane unit and a $SiO_{4/2}$ unit, and when necessary, containing a triorganosiloxane unit and a diorganosiloxane unit.

Examples of the component (B) include 1,1,3,3-tetramethyldisiloxane, methylhydrogencyclopolysiloxane, a methylhydrogensiloxane-dimethylsiloxane cyclic copolymer, a methylhydrogenpolysiloxane with both ends blocked by trimethylsiloxy groups, a dimethylsiloxane-methylhydrogensiloxane copolymer with both ends blocked by trimethylsiloxy groups, a dimethylpolysiloxane with both ends blocked by dimethylhydrogensiloxy groups, and the like.

The viscosity at 25° C. is preferably 1 to 500 mPa·s, in particular, 1 to 100 mPa·s is preferable.

Preferably, a compounding amount of the component (B) is set so that an amount of a hydrogen atom bonded to a silicon atom is 0.3 to 3 mol, more preferably, 0.4 to 2 mol, per 1 mol of the sum of a vinyl group bonded to a silicon atom in the component (A) and an alkenyl group (especially, a vinyl group) bonded to a silicon atom in the straight-chain organopolysiloxane having alkenyl group. If the amount of a hydrogen atom bonded to a silicon atom is less than 0.3 mol, sufficient crosslinking cannot be obtained, and if the amount of a hydrogen atom bonded to a silicon atom exceeds 3 mol, many of the Si—H bonds remain unreacted, resulting in unstable of the cured product physicality.

The component (C) is a catalyst for promoting a hydrosilylation reaction of the vinyl groups of the component (A) and the SiH groups of the component (B).

Example of the component (C) include platinum black, platinum II chloride, chloroplatinic acid, a reaction product of chloroplatinic acid and monovalent alcohol, a complex of chloroplatinic acid with olefin or vinylsiloxane, a platinum catalyst such as platinum bisacetoacetate, a palladium catalyst, a platinum group metal catalyst such as a rhodium catalyst.

A compounding amount of the component (C) is not limited to any specific amount provided that it is an amount necessary for curing, and can be appropriately adjusted according to the kinds of the component (A) and the component (B), a desired curing rate, and so on. Generally, the compounding amount in terms of platinum amount may be in a range from 0.01 to 100 ppm relative to the total weight of the obtained composition, and is preferably in a range from 1 to 50 ppm in view of light transmittance (transparency) of the cured product and cost.

The silicone composition for sealing the light emitting element of the embodiment of the present invention includes the aforesaid components (A), (B) and (C) as basic components, and may further contain a silane coupling agent in order to have adhesiveness to various kinds of support substrates. Examples of the silane coupling agent include epoxy group-containing alkoxysilane, Si—H-containing alkoxysilane, vinyl group-containing alkoxysilane, and the like. A compounding amount of the silane coupling agent is preferably 0.1 to 5 parts by weight of the total amount 100 parts by weight of the components (A), (B) and (C).

Further, various fillers may be blended for higher strength. Considering transparency of the cured product, its average particle size is preferably 100 nm or less, in particular, an average particle size is preferably 50 nm or less. Examples of the filler include fumed silica, wet silica, and the like with a specific surface area measured by a BET method being 150 $m^2/g$ or more. The filler may be used as it is, but a filler that is surface-treated in advance by a treatment agent such as hexamethyldisilazane may be used, or a filler made to react with the aforesaid treatment agent by in-process may be used. A compounding amount of the filler is preferably 0.5 to 100 parts by weight relative to 100 parts by weight of the component (A). If the amount exceeds 100 parts by weight, viscosity of the composition before curing greatly increases, resulting in poor molding workability. On the other hand, if the amount is less than 0.5 parts by weight, the cured product is not given a sufficient characteristic.

Further, a reaction inhibitor such as a compound of phosphorus, nitrogen, sulfur, and so on or an acetylene compound may be blended, and a dye, a pigment, a flame retardant, a heat resisting agent, and so on may be blended in an amount not affecting transparency of the cured product.

The silicone composition for sealing the light emitting element of the embodiment of the present invention can be obtained by uniform mixture, by a stirrer, of the basic components (A), (B) and (C) with any of the aforesaid components. The obtained composition is preferably in a liquid form, and at 25° C., it preferably has a 10,000 mPa·s viscosity or lower, and more specifically, preferably has a 500 to 5,000 mPa·s viscosity.

When the basic components (A), (B) and (C) are mixed with any of the aforesaid components by the stirrer, the curing progresses at room temperature or by heating, but for quick curing, they are preferably heated. A heating temperature is preferably within a range from 50 to 200° C. The cured product thus obtained is in a rubber form, in particular, in a hard rubber form or in a resin form having plasticity.

Its coefficient of linear expansion after curing is $10 \times 10^{-6}$ to $290 \times 10^{-6}/°$ C., and more specifically, is preferably $10 \times 10^{-6}$ to $250 \times 10^{-6}/°$ C. Adjusting the coefficient of linear expansion after curing to a value close to a coefficient of linear expansion of the support substrate of ceramic or plastic makes it possible to reduce a residual stress of the cured product to support substrate, which enables the cured product to have long-term excellent adhesiveness.

The silicone composition for sealing the light emitting element of the present invention can be used as an adhesive, a potting agent, a protectant, a coating, a sealant, or an underfiller for electric and electronic devices. Especially because of its high light transmittance, the composition is suitable as a protectant, a coating, a sealant, or the like of a light emitting device.

Next, a light emitting device of an embodiment of the present invention will be described. In the light emitting device of the embodiment of the present invention, a light emitting element is sealed with the cured product of the above-described silicone composition for sealing the light emitting element. The manner for sealing the light emitting element is not specifically limited, and a light emitting device called a surface-mount type as shown in FIG. 1 is one example.

As shown in FIG. 1, a light emitting device 1 has a light emitting element 2, a support substrate 3 having an opening portion, and a cured product 4 of the silicone composition for sealing the light emitting element.

As a method of sealing the light emitting element 2, the light emitting element 2 is heated and fixed on the support substrate 3 having a lead electrode 5 and made of glass fiber reinforced polyphthalamide resin, by an adhesive such as silver paste. Next, the light emitting element 2 and the lead electrode 5 are connected by a bonding wire 6 such as an Au wire. Thereafter, the silicone composition for sealing the light emitting element of the embodiment of the present invention is potted on the light emitting element 2 and is heated at 50 to 200° C. to be cured. Consequently, the light emitting device 1 can be obtained.

Examples of the light emitting element include a diode, a transistor, a thyristor, a solid-state image sensor, a monolithic IC, and further a semiconductor element in a hybrid IC.

Examples of the light emitting device include a diode, a light emitting diode (LED), a transistor, a thyristor, a photocoupler, a charge coupled device (CCD), a monolithic IC, a hybrid IC, a LSI, and a VLSI, and preferable examples thereof are a light emitting diode (LED), a photocoupler, and the like.

Here, as the support substrate, glass fiber reinforced polyphthalamide is used, but this is not restrictive and any of various kinds of fiber reinforced plastic, ceramics, and the like may be used.

Hereinafter, the present invention will be concretely described by way of examples, but the present invention is not limited to the examples. Part in each of the examples refers to a part by weight, and viscosity in each of the examples refers to a value measured at 25° C.

Characteristics of the cured product of the silicone composition for sealing the light emitting element were measured in the following manner.

[Coefficient of Linear Expansion of the Cured Product]

The cured product was fabricated by heating the silicone composition for sealing the light emitting element at 150° C. for one hour. A coefficient of linear expansion of this cured product was measured by TMA (thermal mechanical analysis) under a temperature range from 25 to 150° C.

[Peeling Test of the Cured Product]

The cured product was fabricated in such a manner that 0.85 g of the silicone composition for sealing the light emitting element was filled in a $10 \times 10 \times 45$ mm glass cell and was heated at 80° for two hours followed by one-hour heating at 150° C. to be cured. Thereafter, after 24-hour moisture absorption under 60° C. and 90% RH, it was heated at 260° C. for 10 minutes. After this was cooled, a state of an interface between the glass cell and the cured product was observed.

Example 1

The following components were mixed and stirred, whereby a silicone composition for sealing a light emitting element was prepared: 62 parts by weight of a vinyl group-containing organopolysiloxane (the content of a vinyl group bonded to a silicon atom 1.0 mmol/g) which is a solid at 25° C. and is represented by the formula 1: $[(CH_3)_3SiO_{1/2}]_5(SiO_{4/2})_8[CH_2=CH(CH_3)_2SiO_{1/2}]$; 38 parts by weight of a straight-chain dimethylpolysiloxane with both ends of a molecular chain blocked by dimethylvinylsiloxy groups (the content of a vinyl group bonded to a silicon atom 0.2 mmol/g) having a 400 mPa·s viscosity and represented by the formula 2: $[CH_2=CH](CH_3)_2SiO_{1/2}][(CH_3)_2SiO]_{130}[(CH_2=CH)(CH_3)_2SiO_{1/2}]$; 12.4 parts by weight of an organohydrogenpolysiloxane (the content of a hydrogen atom bonded to a silicon atom 10 mmol/g) having a 20 mPa·s viscosity and represented by the formula 3: $[(CH_3)_2HSiO_{1/2}]_2(SiO_{4/2})$; 1.5 parts by weight of a silane coupling agent which is a reaction product of $CH_2=C(CH_3)COO(CH_2)_3Si(OCH_3)_3$ and an organosiloxane represented by the formula 4: $[(CH_3)HSiO]_3(CH_3)_2SiO$; and 5 ppm of a platinum catalyst as platinum atoms; and 0.02 parts by weight of a reaction inhibitor represented by the formula 5: $[(CH_2=CH)(CH_3)SiO]_4$.

The characteristics of a cured product of this silicone composition for sealing the light emitting element were measured. The results thereof are shown in Table 1.

Example 2

The following components were uniformly mixed, whereby a silicone composition for sealing a light emitting element was prepared: 50 parts by weight of a vinyl group-containing organopolysiloxane (the content of a vinyl group bonded to a silicon atom 1.0 mmol/g) which is a solid at 25° C. and is represented by the formula 1: $[(CH_3)_3SiO_{1/2}]_5(SiO_{4/2})_8[CH_2=CH(CH_3)_2SiO_{1/2}]$; 50 parts by weight of a vinyl group-containing organopolysiloxane (the content of a vinyl group bonded to a silicon atom 0.7 mmol/g) having a 50 mPa·s viscosity and represented by the formula 6: $[(CH_3)_3SiO_{1/2}]_{13}(SiO_{4/2})_5[CH_2=CH(CH_3)_2SiO_{1/2}]$; 14.9 parts by weight of an organohydrogenpolysiloxane (the content of a hydrogen atom bonded to a silicon atom 10 mmol/g) having a 20 mPa·s viscosity and represented by the formula 3: $[(CH_3)_2HSiO_{1/2}]_2(SiO_{4/2})$; 1.5 parts by weight of a silane coupling agent which is a reaction product of $CH_2=C(CH_3)COO(CH_2)_3Si(OCH_3)_3$ and an organosiloxane represented by the formula 4: $[(CH_3)HSiO]_3(CH_3)_2SiO$; 5 ppm of a platinum catalyst as platinum atoms; and 0.02 parts by weight of a reaction inhibitor represented by the formula 5: $[(CH_2=CH)(CH_3)SiO]_4$.

The characteristics of a cured product of this silicone composition for sealing the light emitting element were measured. The results thereof are shown in Table 1.

Example 3

The following components were uniformly mixed, whereby a silicone composition for sealing a light emitting element was prepared: 40 parts by weight of a vinyl group-containing organopolysiloxane (the content of a vinyl group bonded to a silicon atom 1.0 mmol/g) which is a solid at 25° C. and is represented by the formula 1: $[(CH_3)_3SiO_{1/2}]_5(SiO_{4/2})_8[CH_2=CH(CH_3)_2SiO_{1/2}]$; 60 parts by weight of a straight-chain dimethylpolysiloxane with both ends of a molecular chain blocked by dimethylvinylsiloxy groups (the content of a vinyl group bonded to a silicon atom 0.08 mmol/g) having a 3,000 mPa·s viscosity and represented by the formula 7: $[(CH_2=CH)(CH_3)_2SiO_{1/2}][(CH_3)_2SiO]_{340}[(CH_2=CH)(CH_3)_2SiO_{1/2}]$; 7.9 parts by weight of an organohydrogenpolysiloxane (the content of a hydrogen atom bonded to a silicon atom 10 mmol/g) having a 20 mPa·s viscosity and represented by the formula 3: $[(CH_3)_2HSiO_{1/2}]_2(SiO_{4/2})$; 1.5 parts by weight of a silane coupling agent which is a reaction product of $CH_2=C(CH_3)COO(CH_2)_3Si(OCH_3)_3$ and an organosiloxane represented by the formula 4: $[(CH_3)HSiO]_3(CH_3)_2SiO$; 5 ppm of a platinum catalyst as platinum atoms; and 0.02 parts by weight of a reaction inhibitor represented by the formula 5: $[(CH_2=CH)(CH_3)SiO]_4$.

The characteristics of a cured product of this silicone composition for sealing the light emitting element were measured. The results thereof are shown in Table 1.

Comparative Example 1

The following components were uniformly mixed and stirred, whereby a silicone composition for sealing a light emitting element was prepared: 10 parts by weight of a vinyl group-containing organopolysiloxane (the content of a vinyl group bonded to a silicon atom 1.0 mmol/g) which is a solid at 25° C. and is represented by the formula 1: $[(CH_3)_3SiO_{1/2}]_5(SiO_{4/2})_8[CH_2=CH(CH_3)_2SiO_{1/2}]$; 90 parts by weight of a straight-chain dimethylpolysiloxane with both ends of a molecular chain blocked by dimethylvinylsiloxy groups (the content of a vinyl group bonded to a silicon atom 0.08 mmol/g) having a 3,000 mPa·s viscosity and represented by the formula 7: $[(CH_2=CH)(CH_3)_2SiO_{1/2}][(CH_3)_2SiO]_{340}[(CH_2=CH)(CH_3)_2SiO_{1/2}]$; 3.0 parts by weight of an organohydrogenpolysiloxane (the content of a hydrogen atom bonded to a silicon atom 10 mmol/g) having a 20 mPa·s viscosity and represented by the formula 3: $[(CH_3)_2HSiO_{1/2}]_2(SiO_{4/2})$; 1.5 parts by weight of a silane coupling agent which is a reaction product of $CH_2=C(CH_3)COO(CH_2)_3Si(OCH_3)_3$ and an organosiloxane represented by the formula 4: $[(CH_3)HSiO]_3(CH_3)_2SiO$; 5 ppm of a platinum catalyst as platinum atoms; and 0.02 parts by weight of a reaction inhibitor represented by the formula 5: $[(CH_2=CH)(CH_3)SiO]_4$.

The characteristics of a cured product of this silicone composition for sealing the light emitting element were measured. The results thereof are shown in Table 1.

TABLE 1

| <physicality> | Example 1 | Example 2 | Example 3 | Comparative Example 1 |
|---|---|---|---|---|
| coefficient of linear expansion ($10^{-6}$/° C.) | 250 | 190 | 280 | 330 |
| peeling test | ○ | ○ | ○ | x | note)
○ represents no occurrence of peeling from the glass cell
x represents the occurrence of peeling from the glass cell As is apparent from Table 1, in the comparative example 1, since a compounding amount of the straight-chain organopolysiloxane having vinyl groups exceeds 80% by weight of the total amount of itself and the vinyl group-containing organopolysiloxane having a three-dimensional network structure, it was not possible to adjust a coefficient of linear expansion after curing to $290 \times 10^{-6}$ or lower. On the other hand, according to the silicone compositions for sealing the light emitting element of the examples 1 to 3, it is possible to adjust a coefficient of linear expansion after curing to $10 \times 10^{-6}$ to $290 \times 10^{-6}$/° C., which enables remarkable improvement in adhesiveness of the cured product to the glass cell.

INDUSTRIAL APPLICABILITY

According to the silicone composition for sealing the light emitting element of the present invention, a coefficient of linear expansion after curing can be adjusted to a value close to a coefficient of linear expansion of the support substrate of poliphthalamide or the like. This makes it possible to reduce a residual stress of the support substrate and the cured product, thereby enabling the cured product to have long-term excellent adhesiveness. Therefore, the component can be used as an adhesive, a potting agent, a protectant, a coating, a sealant, an underfiller, and the like for electric and electronic devices. In particular, it is suitable as a protectant, a coating, a sealant, and the like of a light emitting device because of its high light transmittance.

What is claimed is:

1. A silicone composition for sealing a light emitting element comprising:
   (A) a vinyl group-containing organopolysiloxane having a three-dimensional network structure represented by an average unit formula: $(SiO_{4/2})_a(ViR_2SiO_{1/2})_b(R_3SiO_{1/2})_c$ (where Vi represents a vinyl group, R's are identical or different substituted or unsubstituted monovalent hydrocarbon groups other than alkenyl groups, and a, b, and c are positive numbers satisfying that a/(a+b+c) is 0.2 to 0.6 and b/(a+b+c) is 0.001 to 0.2);
   (B) an organohydrogenpolysiloxane which has at least two hydrogen atoms, each hydrogen atom being bonded to a silicon atom per molecule, and has a three-dimensional network structure containing a diorganohydrogensiloxane unit and a $SiO_{4/2}$ unit, the organohydrogenpolysiloxane being contained in such an amount that an amount of a hydrogen atom bonded to a silicon atom is 0.3 to 3.0 mol per 1 mol of a vinyl group bonded to a silicon atom in the component (A); and
   (C) a hydrosilylation catalyst (catalytic amount); and
   a reaction product of a silane coupling agent represented by the formula $CH_2=C(CH_3)COO(CH_2)_3Si(OCH_3)_3$, and an organosiloxane represented by the formula:
   $[(CH_3)HSiO]_3(CH_3)_2SiO$, not containing a filler,
   wherein a coefficient of linear expansion of the composition after curing is $10 \times 10^{-6}$ to $290 \times 10^{-6}$/° C.

2. A silicone composition for sealing a light emitting element comprising:
   ($A_1$) a vinyl group-containing organopolysiloxane having a three-dimensional network structure which is a solid at 25° C. and is represented by an average unit formula: $(SiO_{4/2})_a(ViR_2SiO_{1/2})_b(R_3SiO_{1/2})_c$ (where Vi represents a vinyl group, R's represent identical or different substituted or unsubstituted monovalent hydrocarbon groups other than alkenyl groups, and a, b, and c are positive numbers satisfying that a/(a+b+c) is 0.2 to 0.6 and b/(a+b+c) is 0.001 to 0.2);
   ($A_2$) a straight-chain organopolysiloxane having alkenyl groups whose viscosity at 25° C. is 1 to 100,000 mPa·s, amount of the organopolysiloxane being 10 to 80% by weight of a total amount of the component ($A_1$) and the component ($A_2$);

(B) an organohydrogenpolysiloxane which has at least two hydrogen atoms, each hydrogen atom being bonded to a silicon atom per molecule, and has a three-dimensional network structure containing a diorganohydrogensiloxane unit and a $SiO_{4/2}$ unit, the organohydrogenpolysiloxane being contained in such an amount that an amount of a hydrogen atom bonded to a silicon atom is 0.3 to 3.0 mol per 1 mol of a sum of a vinyl group bonded to a silicon atom in the component ($A_1$) and an alkenyl group bonded to a silicon atom in the component ($A_2$); and (C) a hydrosilylation catalyst (catalytic amount), a reaction product of a silane coupling agent represented by the formula:

$CH_2\!=\!C(CH_3)COO(CH_2)_3Si(OCH_3)_3$, and an organosiloxane represented by the formula: $[CH_3)HSiO]_3(CH_3)_2SiO$, not containing a filler, wherein a coefficient of linear expansion of the composition after curing is $10\times10^{-6}$ to $290\times10^{-6}/°$ C.

3. A silicone composition for sealing a light emitting element consisting essentially of:

(A) a vinyl group-containing organopolysiloxane having a three-dimensional network structure represented by an average unit formula: $(SiO_{4/2})_a(ViR_2SiO_{1/2})_b(R_3SiO_{1/2})_c$ (where Vi represents a vinyl group, R's are identical or different substituted or unsubstituted monovalent hydrocarbon groups other than alkenyl groups, and a, b, and c are positive numbers satisfying that a/(a+b+c) is 0.2 to 0.6 and b/(a+b+c) is 0.001 to 0.2);

(B) an organohydrogenpolysiloxane which has at least two hydrogen atoms, each hydrogen atom being bonded to a silicon atom per molecule, and has a three-dimensional network structure containing a diorganohydrogensiloxane unit and a $SiO_{4/2}$ unit, the organohydrogenpolysiloxane being contained in such an amount that an amount of a hydrogen atom bonded to a silicon atom is 0.3 to 3.0 mol per 1 mol of a vinyl group bonded to a silicon atom in the component (A);

(C) a hydrosilylation catalyst (catalytic amount), a reaction product of a silane coupling agent represented by the formula:

$CH_2\!=\!C(CH_3)COO(CH_2)_3Si(OCH_3)_3$, an organosiloxane represented by the formula:

$[(CH_3)HSiO]_3(CH_3)_2SiO$; and a reaction inhibitor, wherein a coefficient of linear expansion of the composition after curing is $10\times10^{-6}$ to $290\times10^{-6}/°$ C.

4. A silicone composition for sealing a light emitting element consisting essentially of:

($A_1$) a vinyl group-containing organopolysiloxane having a three-dimensional network structure which is a solid at 25° C. and is represented by an average unit formula: $(SiO_{4/2})_a(ViR_2SiO_{1/2})_b(R_3SiO_{1/2})_c$ (where Vi represents a vinyl group, R's represent identical or different substituted or unsubstituted monovalent hydrocarbon groups other than alkenyl groups, and a, b, and c are positive numbers satisfying that a/(a+b+c) is 0.2 to 0.6 and b/(a+b+c) is 0.001 to 0.2);

($A_2$) a straight-chain organopolysiloxane having alkenyl groups whose viscosity at 25° C. is 1 to 100,000 mPa·s, amount of the organopolysiloxane being 10 to 80% by weight of a total amount of the component ($A_1$) and the component ($A_2$);

(B) an organohydrogenpolysiloxane which has at least two hydrogen atoms, each hydrogen atom being bonded to a silicon atom per molecule, and has a three-dimensional network structure containing a diorganohydrogensiloxane unit and a $SiO_{4/2}$ unit, the organohydrogenpolysiloxane being contained in such an amount that an amount of a hydrogen atom bonded to a silicon atom is 0.3 to 3.0 mol per 1 mol of a sum of a vinyl group bonded to a silicon atom in the component ($A_1$) and an alkenyl group bonded to a silicon atom in the component ($A_2$);

(C) a hydrosilylation catalyst (catalytic amount), a reaction product of a silane coupling agent represented by the formula:

$CH_2\!=\!C(CH_3)COO(CH_2)_3Si(OCH_3)_3$, an organosiloxane represented by the formula:

$[(CH_3)HSiO]_3(CH_3)_2SiO$; and a reaction inhibitor, wherein a coefficient of linear expansion of the composition after curing is $10\times10^{-6}$ to $290\times10^{-6}/°$ C.

* * * * *